United States Patent [19]

Helling et al.

[11] Patent Number: 5,292,610
[45] Date of Patent: Mar. 8, 1994

[54] MICROCAPSULES AND THEIR USE

[75] Inventors: Günter Helling, Odenthal; Michael Müller, Bergisch Gladbach; Wolfgang Podszun, Cologne, all of Fed. Rep. of Germany

[73] Assignee: AGFA Gevaert AG, Leverkusen, Fed. Rep. of Germany

[21] Appl. No.: 846,812

[22] Filed: Mar. 6, 1992

[30] Foreign Application Priority Data

Mar. 21, 1991 [DE] Fed. Rep. of Germany ....... 4109287

[51] Int. Cl.$^5$ .................................. G03C 1/72
[52] U.S. Cl. .................................. 430/138; 430/283; 430/284; 430/287; 430/962
[58] Field of Search ............ 430/138, 283, 284, 287, 430/338, 339, 288

[56] References Cited

U.S. PATENT DOCUMENTS

| | | | |
|---|---|---|---|
| 4,399,209 | 8/1983 | Sanders | 430/138 |
| 4,940,645 | 7/1990 | Davis | 430/438 |
| 5,064,744 | 11/1991 | Fukui et al. | 430/138 |
| 5,085,974 | 2/1992 | Fross et al. | 430/284 |

FOREIGN PATENT DOCUMENTS 2159973  6/1985  United Kingdom ......... G03C 1/68

*Primary Examiner*—Christopher Rodee
*Attorney, Agent, or Firm*—Connolly & Hutz

[57] ABSTRACT

Microcapsules containing at least one leuco dye, at least one photopolymerisation initiator and at least one photopolymerisable monomer corresponding to the following formula $$A[-NHCO-X-L_1-(OCO-CR_1=CH_2)_l]_m$$

wherein
A stands for a 3- to 6-valent organic group having the following meanings:
a) a saturated hydrocarbon group having 5 to 25 carbon atoms or
b)

$$A_1\left[-(OCH-CH)_o-OCONH-A_2\underset{R_3\ R_4}{\overset{|\ |}{}}\right]_p$$

or
c)

$$A_1[-(OCH-CH)_o-OC-A_2]_p$$
$$\underset{R_3\ R_4\ \ O}{|\ |\ \|}$$

wherein $A_1$, $A_2$, $R_3$, $R_4$, o and p have the meanings indicated in the description,
X denotes O or $NR_2$,
$L_1$ denotes a divalent or trivalent aliphatic hydrocarbon group whose carbon chain may be interrupted by 1 to 3 oxygen atoms,
$R_1$ denotes hydrogen or methyl,
$R_2$ denotes hydrogen or $C_1$-$C_4$-alkyl,
l denotes 1 or 2 and
m denotes a number from 3 to 6,
are distinguished by improved sensitivity.

11 Claims, No Drawings

MICROCAPSULES AND THEIR USE

This invention relates to microcapsules containing at least one leuco dye, at least one photopolymerisation initiator and at least photopolymerisable monomer and suitable for the production of a colour donor sheet for an imagewise colour transfer process.

U.S. Pat. No. 4 399 209 describes a transfer copying system in which a copying sheet comprising a support and a layer of microcapsules containing a colour producing material and a photosensitive composition is exposed imagewise to actinic radiation. The sheet subjected to this exposure is then brought together with a development sheet and the two sheets are passed through the nip between pressure rollers so that the microcapsules break open and their contents are transferred imagewise to the developer sheet, where they react and produce a coloured copy. The photosensitive composition typically consists of a photocurable composition containing an ethylenically unsaturated compound and a photoinitiator, the colour producing material consisting of a substantially colourless compound which is an electron donor and the developer consisting of an electron receiving compound, e.g. the salt of an aromatic carboxylic acid.

When the copying sheet is exposed imagewise to actinic radiation, the internal phase of the microcapsules is hardened in the regions subjected to the exposure. The internal phase of the microcapsules in those regions which have not been exposed to radiation remain liquid while in those regions which have been exposed to an intensity of radiation intermediate between the two above-mentioned degrees the internal phase of the microcapsules is correspondingly hardened to an intermediate degree. The microcapsules can thus be broken open in the unexposed regions so that the inner phase is released when the exposed sheet is subjected to a uniform force which breaks open the microcapsules. The microcapsules of the less intensely exposed regions may break open and release the internal phase to an extent corresponding to the under-exposure. The internal phase of the microcapsules is thus transferred imagewise to the developer sheet, on which the copy is obtained.

A copying system including photocurable microcapsules containing a photoinitiator and the precursor of a photoinhibitor is described in DE-OS 3 520 159. The precursor of the photoinhibitor is converted into a molecule which prevents photocuring on exposure to radiation of a suitable wavelength or intensity. Negative images are obtained by first exposing the system to an imagewise irradiation to convert the precursor of the photoinhibitor into its inhibiting form and then exposing the system to a uniform irradiation which is capable of curing the microcapsules which are thereafter subjected to a uniform force which breaks open the microcapsules.

According to DE-OS 36 23 522, copying materials using photosensitive microcapsules have improved sensitivity if the microcapsules contain a photoinitiator system comprising an absorber, a coinitiator and an autooxidizing agent. The absorber is a compound such as an aromatic ketone; the coinitiator and the autooxidizing agent differ but may be compounds such as N,N-dialkylanilines.

The coinitiator and the autooxidizing agent are so chosen that the production of free radicals and the consumption of oxygen proceed with optimum effect so that a highly sensitive copying material is obtained.

Compounds described as ethylenically unsaturated, polymerisable compounds include the known, commercially available acrylates and methacrylates, trimethylolpropane-triacrylate and -trimethacrylate being used particularly frequently. The main disadvantage of the above-mentioned materials is their insufficient sensitivity, which is directly connected with the speed of polymerisation of the polymerisable compounds or photocurable resins contained in the microcapsules.

It is thus a main object of the present invention to provide ethylenically unsaturated, polymerisable compounds which in combination with other components of the capsule contents, regarded as photocurable resins, polymerize at high speed and enable a change of state from liquid to solid to proceed rapidly and thereby increase the sensitivity.

Monomers and monomer mixtures have now been found which very rapidly polymerise and become solid in combination with photoinitiators as so-called photocurable resins.

This invention therefore relates to microcapsules containing at least one leuco dye, at least one photopolymerisation initiator and at least one photopolymerisable monomer, characterized in that the photopolymerisable monomer corresponds to the following formula:

$$A[-NHCO-X-L_1-(OCO-CR_1=CH_2)_1]_m \qquad (I)$$

wherein

A stands for a 3- to 6-valent group having the following meanings:
a) a saturated hydrocarbon group having 5 to 25 carbon atoms or
b)

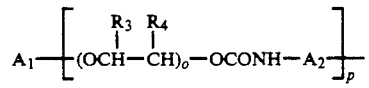

wherein
$A_1$ denotes a straight chained or branched aliphatic group having 2 to 20 carbon atoms and optionally containing 1 to 3 oxygen atoms, an aromatic group having 6 to 24 carbon atoms, an araliphatic group having 7 to 26 carbon atoms or a cycloaliphatic group having 6 to 26 carbon atoms,
$R_3$ and $R_4$ denote hydrogen or methyl,
$A_2$ denotes a saturated hydrocarbon group having 5 to 25 carbon atoms,
o denotes a number from 0 to 5 and
p denotes a number from 2 to 6 or
c)

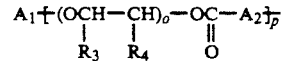

wherein $A_1$, $A_2$, $R_3$, $R_4$, o and p have the meanings indicated above
X denotes O or $NR_2$,
$L_1$ denotes a divalent or trivalent aliphatic hydrocarbon group whose carbon chain may be interrupted by 1 to 3 oxygen atoms, $R_1$ denotes hydrogen or methyl,
$R_2$ denotes hydrogen or $C_1$-$C_4$-alkyl,
l stands for 1 or 2 and
m stands for a number from 3 to 6.
$L_1$ preferably has 2 to 15 carbon atoms and is straight chained, branched or cyclic.

The following are examples of suitable saturated hydrocarbon groups A:

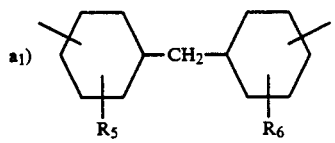

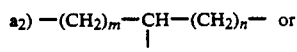

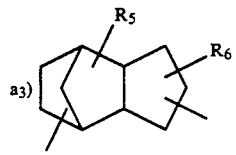

wherein
$R_5$ and $R_6$ denote hydrogen or $C_1$-$C_4$-alkyl and
m and n denote each a number from 2 to 6.

The quantity of photopolymerisable monomers corresponding to Formula I is from 25 to 98% by weight, preferably from 35 to 95% by weight, based on the internal phase of the microcapsules. The internal phase of the microcapsules is the mixture of photopolymerisable monomers, photoinitiator, leuco dye and optionally other auxiliary agents.

The monomers according to the invention may be mixed with low viscosity monomers, so-called reactive diluents, to adjust them to a suitable viscosity for use. The reactive diluents are generally used in quantities of from 0–60% by weight, preferably from 5–50% by weight, based on the internal phase of the microcapsules.

Examples of suitable reactive diluents include monoacrylates and monomethacrylates such as n-hexylacrylate, n-hexylmethacrylate, ethyl hexyl acrylate, ethyl hexyl methacrylate, n-octylacrylate, n-octylmethacrylate, stearyl methacrylate, cyclohexylacrylate, cyclohexylmethacrylate, 4-tert.-butyl-cyclohexylmethacrylate, benzyl acrylate, benzyl methacrylate, phenyl ethyl acrylate, phenyl ethyl methacrylate, phenyl propyl acrylate, phenyl propyl methacrylate, phenyl octyl acrylate, phenyl nonyl acrylate, phenyl nonyl methacrylate, 3-methoxybutyl methacrylate, butoxy ethyl acrylate, furfuryl methacrylate and tetrahydrofurfuryl acrylate. Particularly suitable reactive diluents are those which have two or more double bonds, for example the following comonomers: Glycerol di(meth)acrylate, triethylene glycol di(meth)acrylate, triethylene glycol di(meth)acrylate, tetraethyleneglycol di(meth)acrylate, 1,12-dodecanediol di(meth)acrylate, 1,6-hexanediol di(meth)acrylate, diethyleneglycol di(meth)acrylate and trimethylolpropane tri(meth)acrylate.

Comonomers having a boiling point above 100° C. at 13 mbar are particularly preferred.

The following are examples of monomers according to the invention:

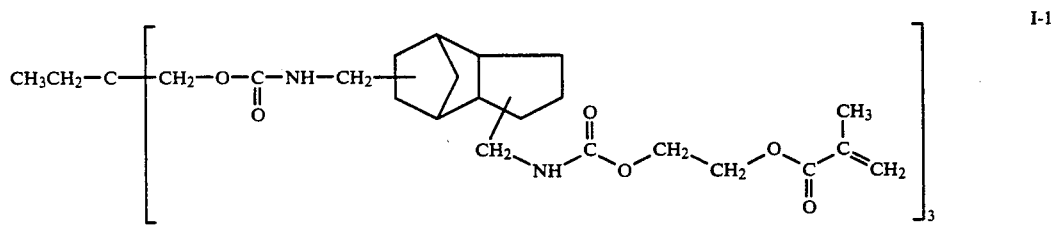

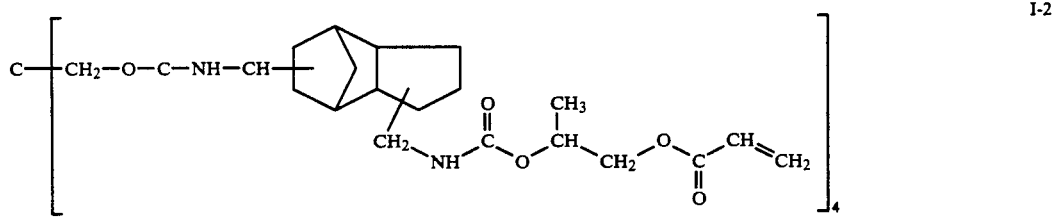

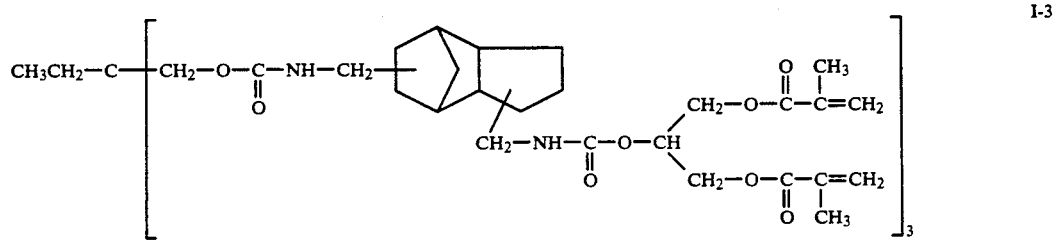

-continued
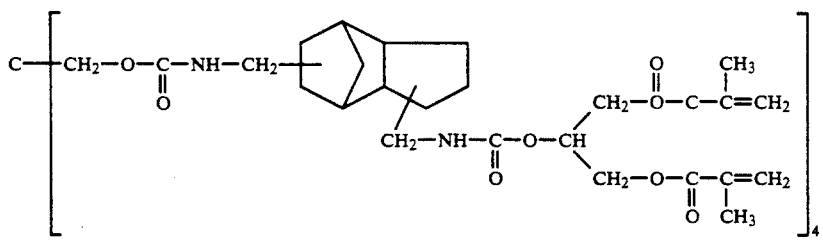
I-4
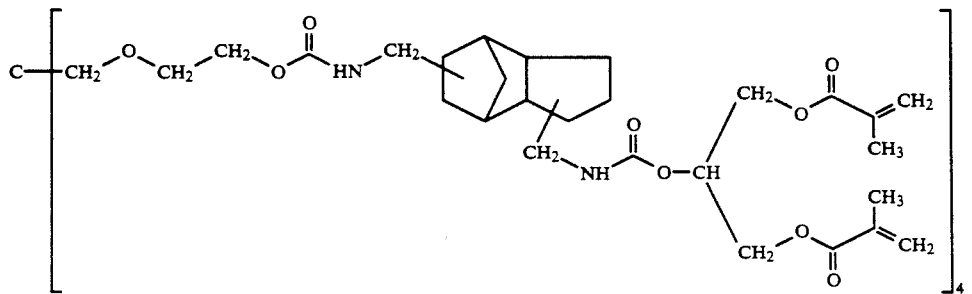
I-5
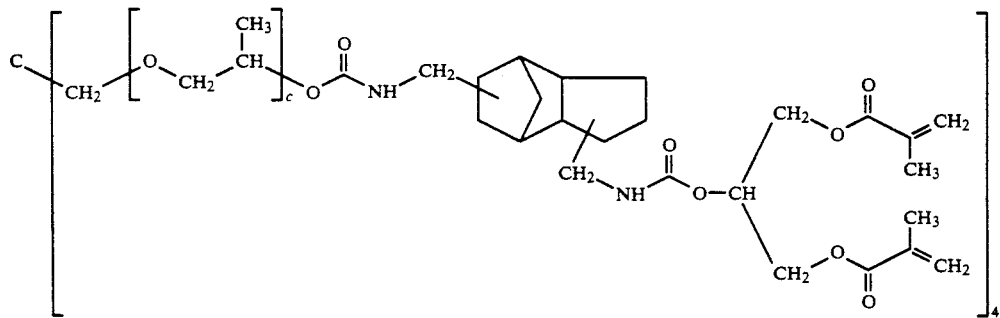
I-6
c = 1.225 (statistical average for 4 chains)
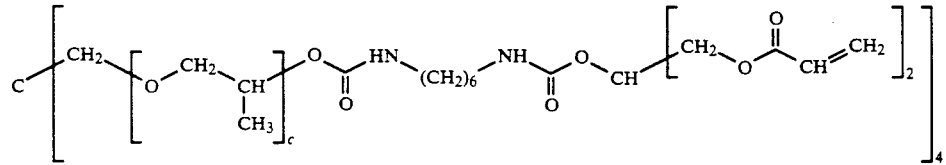
I-7
c = 1.225 (statistical average for 4 chains)
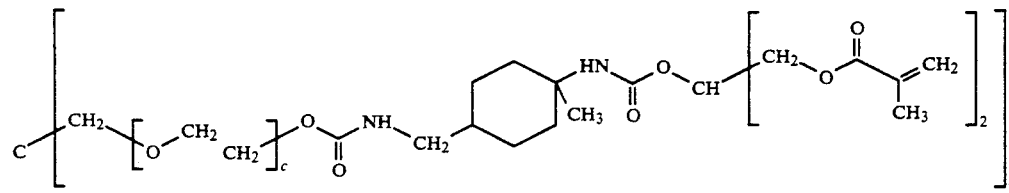
I-8
c = 1.225 (statistical average for 4 chains)
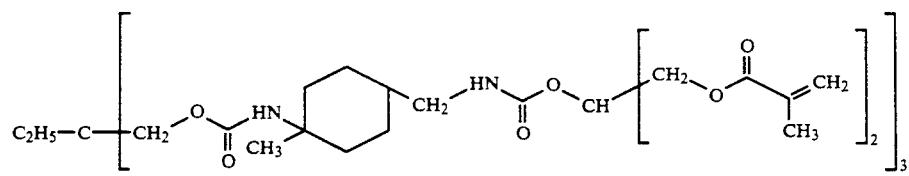
I-9

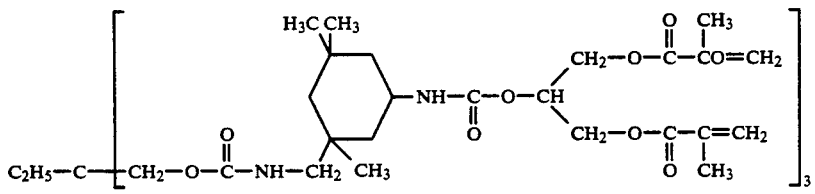

The material of the wall of the microcapsules may consist of the known polymers which have been described for this purpose. The material of the wall must not be caused to swell by the polymerisable compounds present in the interior capsules.

Examples of suitable wall materials include polyurethanes, polyureas, polyamides, polyesters, ammonium aldehyde resins, gelatines, epoxy resins and polycarbonates.

Materials built up of several components are also suitable such as polyester polyurethanes, polycarbonate polyureas and polyester polyurethane polyureas.

The average particle size of the microcapsules is in the range of from 1 μ to 40 μ, preferably from 2μ-20μ. Average particle sizes of from 3μ-15 μ are particularly preferred.

The colour producing substances in the light-sensitive material are preferably used in a quantity of from I to 40% by weight, based on the polymerisable compounds. A quantity of from 2-20% by weight is particularly preferred.

In a preferred embodiment, colourless dye precursors are microencapsulated together with the multifunctional monomers, the photoinitiator and optionally other additives. Electron donors and leuco dyes are examples of suitable dye precursors. Such colourless compounds contain, as their structural element, a lactone, a lactam, a sultone, a spiropyran, ester or amide structures such as triarylmethane compounds, bisphenylmethane compounds, xantham compounds, fluorans or thiazines. Suitable dye triplets are described, for example, in DE-OS 3 739 212 and U.S. Pat. No. 4 324 817.

The following, in particular, are suitable: Triphenylmethane compounds: 3,3-Bis-(p-dimethylaminophenyl)-6-dimethylaminophthalide ("Crystal violet lactone", hereinafter referrred to as "C.V.L.") and 3,3-bis-(p-dimethylaminophenyl)-phthalide ("Malachite green lactone"); Diphenylmethane compounds: 4,4'-bis-dimethylamino-benzhydryl-benzyl ether, N-halogen-phenyl leucolamine, N-β-naphthyl leucolamine, N-2,4,5-trichlorophenyl leucolamine, N-2,4-dichlorophenyl leucolamine; Xanthene compounds: Rhodamine-β-anilinolactam, rhodamine-62 -(p-nitroaniline)-lactam, rhodamine-β-(p-chloroaniline)-lactam, 7-dimethylamino-2-methoxyfluoran, 7-diethylamino- 3-methoxyfluoran, 7-diethylamino-3-methyl-fluoran, 7-diethylamino-3-chlorofluoran, 7-diethylamino-3-chloro-2-methylfluoran, 7-diethylamino-2,4-dimethylfluoran, 7-diethylamino-2,3-dimethylfluoran, 7-diethylamino-(3-acetylmethylamino)-fluoran, 7-diethylamino-3-methylfluoran, 3,7-diethylaminofluoran, 7-diethylamino-3-(dibenzylamino)-fluoran, 7-diethylamino-3-(methyl benzylamino)-fluoran, 7-diethylamino-3-(chloroethyl-methylamino)-fluoran, 7-diethylamino-3-(dichloroethylamino)-fluoran, 7-diethylamino-3-(diethylamino)-fluoran; Thiazine compounds: N-benzoyl-leucomethylene blue, o-chlorobenzoyl-leucomethylene blue, p-nitrobenzoyl-1 leucomethylene blue; Spiro compounds: 3-methyl-2,2'-spirobis-(benzo(f)-chromene).

Examples of solvents which dissolve these dye precursors include chlorinated diphenyl, chlorinated paraffin, cotton seed oil, ground nut oil, silicone oil, tricresyl phosphate, monochlorobenzene, partially hydrogenated terphenyls, alkylated diphenyls, alkylated naphthalenes, aryl ethers, arylalkyl ethers, higher alkylated benzene, and others.

Diluents are frequently added to the solvents, for example, kerosine, n-paraffins and isoparaffins.

Polymerisation of the capsule contents is released by a photoinitiator. Suitable photoinitiators disintegrate when irradiated into radicals and release radical polymerisation, or into ions and release ionic polymerisation. Compounds which release ionic polymerisation may be cations or anions.

The photoinitiators used may be of the type which disintegrate on exposure to UV light or they may be of the type which disintegrate on exposure to visible light of a certain wavelength, depending on the material used.

Examples of suitable initiators sensitive in the UV range include benzoin alkyl ethers, diarylketones, alkoxyphenyl lactones, o-acylated oximinoketones, benzophenones which are optionally substituted, e.g. Michlers ketone, xanthones, polycyclic quinones, thioxanthones, fluorenones or polycyclic compounds containing chloroalkyl groups or chlorosulphonyl groups. It is frequently advantageous to use a combination of these compounds.

Examples of photoinitiators which are active in the visible range include Bengal rose-iodonium and Bengal rose-pyrilium complexes, combinations of a basic aniline compound with a triazine or quinazoline substituted by halogenated methyl groups according to EP 313 007, combinations of xanthene, thiazine, pyranine or porphyrine dyes, and trihalogenated methyl compounds which can be decomposed photolytically, such as phenyl trihalogen methyl sulphone, phenyl trihalogen methyl lactones or phenyl tribromomethyl sulphone, and cyanine-borate ion complexes according to J. Am. Chem. Soc. 110,2326 (1988).

The quantity of photo-initiator is generally from 0.01 to 10% by weight, preferably from 0.05 to 4% by weight, based on the polymerisable components of the capsule contents.

EXAMPLES

Example 1

The following components were intensively mixed:
50.0 g of stellate urethane-methacrylate I-4
50.0 g of hexanediol dimethacrylate
120 mg of 2,6-di-tert.-butyl cresol
200 mg of camphor quinone 500 mg of p-dimethylaminobenzene sulphonic acid-N,N-diallylamide 2,6-Di-tert.-butyl cresol functions as stabilizer; camphor quinone and p-dimethylaminobenzene sulphonic acid-N,N-diallylamide constitute the initiator system.

The sample was irradiated at 30° C. in DSC (Differential Scanning Calorimetry) by means of a halogen lamp (75 W) with heat protective filter. Samples having the same composition were used without photoinitiator as reference. The sample was flushed with nitrogen during the experiment.

The results are evaluated according to the following magnitudes:

$t_{max}$: Time to reach the maximum of the reaction
$t_{10\%}$: Time to reach 10 percent conversion
Consistency (10%): Consistency of a sample polymerised to a conversion of 10%.

The results are shown in the following Table.

COMPARISON EXAMPLE 1

The following components were intensively mixed and irradiated as in Example 1:
100.0 g of trimethylolpropane trimethacrylate
120 mg of 2,6-di-tert.-butyl cresol
200 mg of camphor quinone
500 mg of p-dimethylaminobenzene sulphonic acid-N,N-diallylamide.

The results are also shown in the following Table.

| Photocurable resin | tmax [min] | $t_{10\%}$ [min] | Consistency (10%) |
|---|---|---|---|
| Example 1 | 1.2 | 1.0 | solid |
| Comparison Example 1 | 2.0 | 1.8 | liquid |

The comparison shows that the photocurable microcapsules according to the invention harden more rapidly than comparable capsules known in the art, with the result that the recording process described has greater sensitivity.

EXAMPLE 2

480 mg of 2,6-di-tert.-butyl cresol, 2.0 of camphor quinone, 2.5 g of p-dimethylaminobenzene sulphonic acid-N,N-diallylamide, 13.9 g of crystal violet lactone and 98.4 g of hexamethylene diisocyanate-isocyanurate are dissolved in 480 g of trimethylolpropane with stirring and exclusion of light. This organic phase is added to 1138 g of a 0.5% by weight aqueous polyvinyl alcohol solution and emulsified, using an ultra sound apparatus. An amine solution of 9.7 g of diethylene triamine and 5.1 g of ethylene diamine in 260 g of salt-free water is added to the emulsion with stirring. After further stirring for 2 hours at 60° C., a microcapsule dispersion having an average particle diameter of 10 μm is obtained.

The microcapsule dispersion thus obtained was dialysed for the removal of impurities and adjusted to a solids content of 5% by weight (comparison).

Preparation of a Donor Sheet 1 g of a 5% by weight aqueous solution of a surface active agent was introduced into 9 g of the microcapsule dispersion and the resulting dispersion was applied to a polyethylene terephthalate support by means of a laboratory casting machine. A microcapsule layer of 10 μm is obtained after drying at 40° C. (comparison).

Another donor sheet (according to the invention) was prepared by the same method except that the mixture according to the invention of 50% by weight of stellate urethane(meth)acrylate of Example 1 and 50% by weight of hexanediol dimethacrylate was used instead of trimethylolpropane trimethacrylate.

The donor sheet is exposed to a halogen lamp (75 W) with heat protective filter through a grey step wedge placed in contact. The exposure time is varied and the time $t_1$ required for copying 50% of the steps is measured.

In another test series, the comparison donor sheet is similarly exposed and the time $t_0$ required for copying 50% of the steps is measured. The quotient $t_0/t_1$ is then calculated.

To process the exposed donor sheet, the donor sheet and a receptor sheet prepared as described in OS 3 739 212 are together passed through a pair of pressure rollers under a pressure of 480 kg/cm². A positive image of the step wedge is obtained on the receptor sheet. The quotient $$\frac{t_0}{t_1}$$

is a relative measure of the increase in sensitivity. From the parts measured it is calculated to be $t_0/t_1 = 1.9$. The Example shows that the irradiation time required for producing an image from the donor sheet according to the invention is reduced by about 50%.

We claim:

1. Microcapsules comprising a wall containing an internal phase comprising at least one leuco dye, at least one photopolymerisation initiator and at least one photopolymerisable monomer, characterized in that the photopolymerisable monomer corresponds to the following formula $$A[-NHCO-X-L_1-(OCO-CR_1=CH_2)_n]_m$$

wherein
A denotes a tri- to hexa-valent organic group having the following meanings:
a) a saturated hydrocarbon group having 5 to 25 carbon atoms or
b)

$$A_1\left[-(OCH-CH)_o-OCONH-A_2\underset{R_3\ R_4}{\phantom{I}}\right]_p$$

wherein
$A_1$ stands for a straight chained or branched aliphatic group having 2 to 20 carbon atoms and optionally containing 1 to 3 oxygen atoms, an aromatic group having 6 to 24 carbon atoms, an araliphatic group having 7 to 26 carbon atoms or a cycloaliphatic group having 6 to 26 carbon atoms,
$R_3$ and $R_4$ denote hydrogen or methyl,
$A_2$ denotes a saturated hydrocarbon group having 5 to 25 carbon atoms,
o denotes a number from 0 to 5 and
p denotes a number from 3 to 6, or
c)

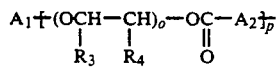

wherein $A_1$, $A_2$, $R_3$, $R_4$, o and p have the meanings indicated above,

X denotes O or $NR_2$, $L_1$ denotes a divalent or trivalent aliphatic hydrocarbon group whose carbon chain may be interrupted by 1 to 3 oxygen atoms, $R_1$ denotes hydrogen or methyl, $R_2$ denotes hydrogen or $C_1$-$C_4$-alkyl, n stands for 2 and m stands for a number from 3 to 6.

2. Microcapsules according to claim 1, characterized in that $L_1$ has 2 to 15 carbon atoms and is straight chained, branched or cyclic.

3. Microcapsules according to claim 1, wherein A is selected from the group consisting of

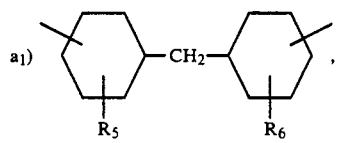

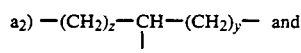

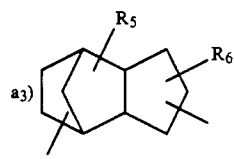

wherein $R_5$ and $R_6$ denote hydrogen or $C_1$-$C_4$-alkyl and x and y denote each a number from 2 to 6.

4. Microcapsules according to claim 1, wherein the quantity of photopolymerisable monomers corresponding to the formula

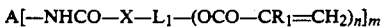

is from 25 to 98% by weight, based on the internal phase of the microcapsules.

5. Microcapsules according to claim 1, wherein the quantity of photopolymerisable monomers corresponding to the formula

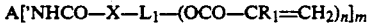

is from 35 to 95% by weight, based on the internal phase of the microcapsules.

6. Microcapsules according to claim 1, wherein, in addition to said at least one leuco dye, at least one photopolyermisation initiator and at least one photopolymerisable monomer, said internal phase further comprises reactive diluents in a quantity of from 5–50% by weight, based on the internal phase of the microcapsules.

7. Microcapsules according to claim 6, wherein said reactive diluents comprises at least one of monoacrylates and monomethyacryates.

8. Microcapsules according to claim 6, wherein said reactive diluents comprise at least one comonomer selected from the group consisting of glycerol di(meth)acrylate, triethylene glycol di(meth)acrylate, tetraethyleneglycol di(meth)acrylate, 1,12-dodecanediol di(meth)acrylate, 1,6-hexanediol di(methy)acrylate, diethyleneglycol di(methy)acrylate and trimethylolpropane tri(meth)acrylate.

9. Microcapsules according to claim 1, wherein said wall comprises at least one material selected from the group consisting of polyurethanes, polyureas, polyamides, polyesters, ammonium aldehyde resins, gelatines, epoxy resins and polycarbonates.

10. Microcapsules according to claim 1, wherein said microcapsules have an average particle size of from 1–40μ.

11. Microcapsules according to claim 1, wherein said at least one photopolymerisation initiator disintegrates on exposure to at least one of UV light and visible light.

* * * * *

UNITED STATES PATENT AND TRADEMARK OFFICE
CERTIFICATE OF CORRECTION

PATENT NO. : 5,292,610
DATED : March 8, 1994
INVENTOR(S) : Helling, et al

Page 1 of 3

It is certified that error appears in the above-indentified patent and that said Letters Patent is hereby corrected as shown below:

On the title page, Item [57] and Column 2, line 3, the formula

" $A[-NHCO-X-L_1-(OCO-CR_1=CH_2)]_m$ "

should read:

-- $A[-NHCO-X-L_1-(OCO-CR_1=CH_2)_n]_m$ -- line 22, "l denotes 1 or 2 and" should read --n denotes 1 or 2 and--.

At column 2, line 30, the formula " $A[-NHCO-X-L_1-(OCO-CR_1=CH_2)]_m$ "

should read -- $A[-NHCO-X-L_1-(OCO-CR_1=CH_2)_n]_m$ --.

At column 3, line 3, "l stands for 1 or 2 and" should read --n stands for 1 or 2 and--.

At column 3, lines 16 and 17,

" $a_2)-(CH_2)_m-CH-(CH_2)_n-$ or " should read
      |

-- $a_2)-(CH_2)_x-CH-(CH_2)_y-$ or --.
      |

At column 3, line 29, "m and n denote each a number from 2 to 6." should read -- x and y denote each a number from 2 to 6.--.

UNITED STATES PATENT AND TRADEMARK OFFICE
CERTIFICATE OF CORRECTION

PATENT NO. : 5,292,610
DATED : March 8, 1994
INVENTOR(S) : Helling, et al

Page 2 of 3

It is certified that error appears in the above-indentified patent and that said Letters Patent is hereby corrected as shown below:

In claim 5, at column 12, line 12, the formula

" $A[\text{'NHCO}-X-L_1-(OCO-CR_1=CH_2)_n]_m$ "

should read -- $A[-NHCO-X-L_1-(OCO-CR_1=CH_2)_n]_m$ --.

In claim 6, at column 12, line 19, please change "photopolyermisation" to --photopolymerisation--.

In claim 7 at column 12, line 25, please change "comprises" to --comprise--.

In claim 7 at column 12, line 26, please change "monomethyacryates" to --monomethacrylates--.

In claim 8 at column 12, line 32, please change "di(methy)acrylate" to --di(meth)acrylate--.

UNITED STATES PATENT AND TRADEMARK OFFICE
CERTIFICATE OF CORRECTION

PATENT NO. : 5,292,610
DATED : March 8, 1994
INVENTOR(S) : Helling, et al

It is certified that error appears in the above-indentified patent and that said Letters Patent is hereby corrected as shown below:

In claim 8 at column 12, line 33, please change "di(methy)acrylate" to

--di(meth)acrylate--.

Signed and Sealed this

Sixth Day of September, 1994

Attest:

BRUCE LEHMAN

Attesting Officer   Commissioner of Patents and Trademarks